United States Patent

Winter et al.

[19]

[11] Patent Number: 5,805,862
[45] Date of Patent: Sep. 8, 1998

[54] METHOD OF FORMING AN INTEGRATED CIRCUIT

[75] Inventors: Marlan L. Winter; Kenneth P. Tumin; Steven P. Lindquist, all of Austin, Tex.

[73] Assignee: Motorola, Inc., Schaumburg, Ill.

[21] Appl. No.: 558,518

[22] Filed: Nov. 16, 1995

[51] Int. Cl.[6] .................................................. G06F 15/60
[52] U.S. Cl. ...................... 395/500; 364/578; 364/488; 364/489; 364/490; 364/491; 371/22.2
[58] Field of Search .................... 364/578, 488, 364/489, 490, 491; 395/500; 371/22.2

[56] References Cited

U.S. PATENT DOCUMENTS

| 4,598,364 | 7/1986 | Gum et al. | 364/300 |
| 4,730,315 | 3/1988 | Saito et al. | 371/19 |
| 5,394,347 | 2/1995 | Kita et al. | 364/578 |

OTHER PUBLICATIONS

Hayes, et al.; "An Assembler for Experimental Systems Use;" 5th Australian Computer Conference; pp. 298–305, (1972).

Ohta, et al.; "Generating comment lines for assembler programs by using a program comprehension paradigm;" Abstract; '94 International Computer Symposium Conf. Proceedings (Dec. 12–15, 1994).

Lai, et al.; "Arden—Architecture Development Environment;" IEEE TENCON Proceedings '93; pp. 5–9, (1993).

Goatley; "Renumbering MACRO Local Labels;" VAX Professional; 3 pgs., (1990).

Mapou; "Tachistoscopic timing on the TRS–80;" Behavior Research Methods & Instrumentation 1982; vol. 14(6), pp. 534–538, (1982).

Primary Examiner—Kevin J. Teska
Assistant Examiner—A. S. Roberts
Attorney, Agent, or Firm—George R. Meyer

[57] ABSTRACT

A simulation input and a model file are generated. The simulation input file is processed to generate object code, entries, line counts, and comment lines. A simulation program is run that uses the object code, entries, line counts, and input comment lines. A machine captures and links output comment lines with their associated test vectors by using the entries and line counts to form a simulation results file. After the simulation, the simulation results file can be reviewed. After simulation, masks (30, 40, 50, 60, 70) are generated that are used to form integrated circuits (20). The present invention can also be used for testing integrated circuits. The test methods use a test input file generated from the simulation results file.

13 Claims, 4 Drawing Sheets

FIG. 9

METHOD OF FORMING AN INTEGRATED CIRCUIT

RELATED APPLICATION

This is related to U.S. Pat. application No. 08/558,459 filed on even date and assigned to the current assignee hereof.

FIELD OF THE INVENTION

The present invention relates to electronic circuit designs and integrated circuits, and in particular, to verification of those electronic circuit designs and to the formation and testing of integrated circuits based on those electronic circuit designs.

BACKGROUND OF THE INVENTION

Electronic circuit designs are becoming more complex as the number of components on an integrated circuit increase. Before forming the integrated circuit, a simulation of its electronic circuit design is typically performed. At least one person usually generates an input file and a model file. The input file includes instructions that guide and control the simulation. The model file includes a hardware description of the electronic device.

The input file is processed using an assembler or the like to generate object code. A comment table with comment lines is generated by post processing after the assembler. A simulation program is run that uses the object code and the model file. During the simulation, test vectors are simulated. The test vectors represent the states of the electrodes of the electronic circuit design during the simulation. The test vectors are used for testing finished integrated circuits or for identifying good simulations that can be used to validate further simulations of the electronic circuit design.

When the simulation is completed, the comment lines need to be placed near their associated test vectors to be useful. A person can manually place the comment lines of the comment table near their associated test vectors. This can be quite time consuming because several hundreds of thousands of test vectors may have been generated. If the input file is changed, the entire process of placing the comment lines with their associated test vectors is repeated. Also, a person can make mistakes that can cause comment lines to become associated with the wrong test vectors.

Another way to place the comment lines near their associated test vectors is to use a computer. The computer places the comment lines near their associated test vectors based upon assumptions that the simulation included a linear (sequential) program flow and that a fixed number of test vectors are executed for each comment line. A problem arises when the assembly file has a non-sequential instruction, such as a "do loop," an "if-then" statement, a "goto" instruction, a conditional branch, a branch instruction, a subroutine, and the like.

The non-sequential instruction throws off the count for test vectors. This can cause the comment lines to be placed near the wrong test vector because the assumptions used by the computer may not be correct. After outputting the test vectors and comments, someone typically has to adjust manually ("cut and paste") comment lines to place each of the comment lines near their associated test vectors.

A need exists for placing comment lines adjacent to their associated test vectors within a results file that includes both test vectors and comment lines. A need also exists for placing the comment lines and their associated test vectors without having a person double check the results file that was machine generated.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

When simulating an electronic circuit design or testing an integrated circuit, a results file is generated by capturing test vectors and output comment lines. The output comment lines are placed adjacent to their associated test vectors during the simulation or test. The placement is performed using a machine. A person does not confirm the placement is correct or to adjust manually output comment lines within a results file. The present invention is better understood with the embodiments described below.

Figure 1:
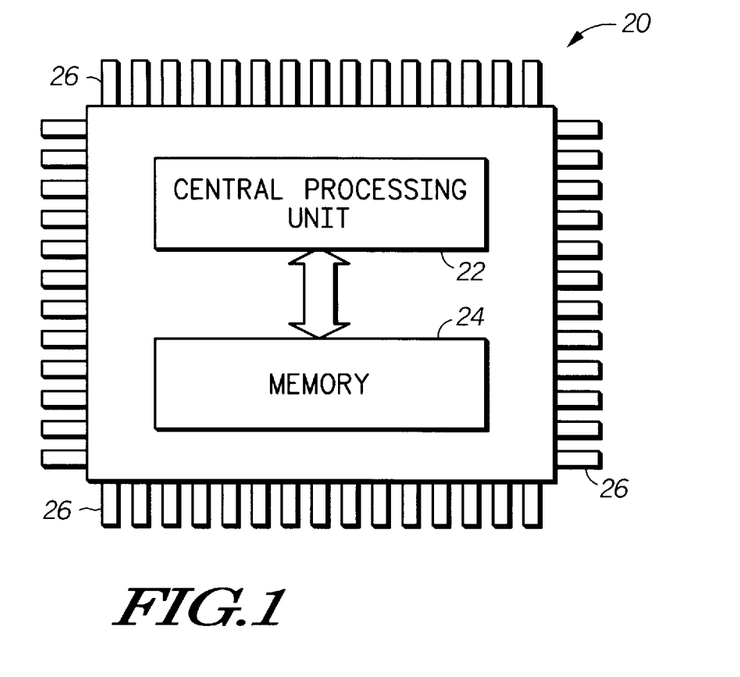
FIG. 1 includes a schematic view of an integrated circuit.

The processes of the present invention can be used to simulate or test an integrated circuit 20 as shown in FIG. 1. The integrated circuit 20 can be a microcontroller, microprocessor, a digital signal processor, or the like. In one embodiment, the integrated circuit 20 includes a central processing unit 22 that is bi-directionally coupled to a memory 24. Other circuitry and modules may be included within the integrated circuit 20 but are not shown in FIG. 1. The integrated circuit also includes electrodes 26 around the edges of the integrated circuit 20. The electrodes 26 are also referred to as pins, leads, ports, or the like.

Figure 2:
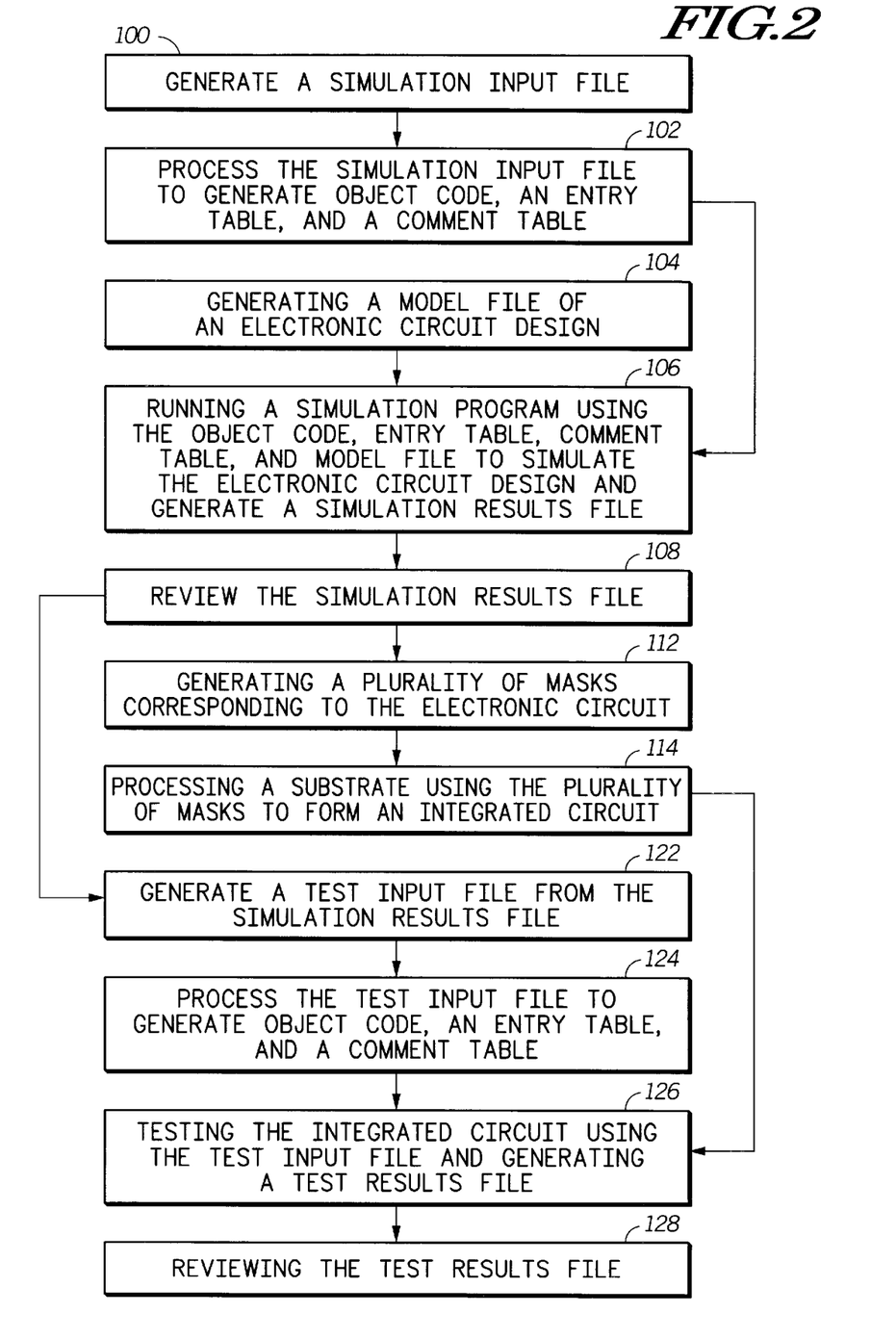
FIG. 2 includes a process flow diagram of an embodiment of the present invention.

An embodiment of the present invention related to the simulation, formation, and testing of the integrated circuit 20 is discussed below. FIG. 2 includes a process flow diagram of the embodiment. A simulation input file is generated (step 100). The simulation input file includes source code and comment lines. As used in this specification, source code is a file, portion of a file, or equivalent to be used by a computer or data processor that is essentially in a human-readable form. The source code includes instructions used to test the electronic circuit design.

Table I includes a main program and a subroutine ("MEMCK"). Within the main program and MEMCK subroutine, lines having a semicolon are comment lines. All other lines include instructions, directives, or the like, and are collectively referred to as "instruction lines."

TABLE I

```
MAIN PROGRAM
    ORG $6000
    LDX #$0000 INITIALIZE X REG
    RUN MEMCK
; READ INPUT ON PORTH
    LDD PORTH
      •
      •
      •
MEMCK SUBROUTINE
    FOR I>0, I=4, I - -
    BEGIN
    STM I #$0000
    RDM I
    IF RDM I≠$0000, "MEM ERR AT" I "FOR 0"
    STM I ≠$0001
    RDM I
    IF RDM I≠$0001, "MEM ERR AT" "FOR 1"
    END
```

Before continuing, "non-sequential" instructions should be understood. As used in this specification, a non-sequential instruction is an instruction is capable of selectively changing the program flow. Examples include: (1) not performing some instructions of a program or subroutine, (2) performing more than one instruction per instruction line in the source code of a program or any of its subroutines, or (3) conditional branches or branch instructions. Some specific examples include an "if-then" statement, a "goto" instruction, a "do loop," a subroutine within a program or another subroutine, or the like. These examples are meant to illustrate and not meant to be exclusive of other instructions. Referring to Table I, "RUN MEMCK" is a non-sequential instruction because it runs the subroutine "MEMCK." Within the "MEMCK" subroutine, the first line signifies a "do loop" that will be discussed later with the "MEMCK" subroutine.

The first line of the main program establishes that an instruction cache will have memory locations that start with a hexadecimal (base sixteen) value of six thousand ($6000). Other values including binary (base two) values, decimal (base ten) values, or the like can be used. In this example, a "$" before a number indicates that the number is a hexadecimal value. The second line initializes register "X" with zeros. The third line of a program runs MEMCK, which is a subroutine that checks memory cells of a memory array. "RUN MEMCK" is a non-sequential instruction.

After the "RUN MEMCK" line in the main program, a comment line states "READ INPUT ON PORTH." The last line of the portion of the main program in TABLE I is an instruction to load register "D" with the signal on port H ("LDD PORTH"), which is an electrode 26 of the electronic circuit design of the integrated circuit 20.

The "MEMCK" subroutine is used to simulate four memory cells within the memory 24 to determine if zeros and ones can properly be stored and read from those memory cells. The memory could include a random-access memory (RAM), a read-only memory (ROM), or the like. Although this subroutine only simulates four memory cells, the memory could check every cell within that RAM, ROM, or the like that could include over 1000 memory cells.

The first line of the subroutine is a "do-loop" that starts with I=4 and counts down by one ("I - -") for each iteration of the "do loop." The "do loop" continues as long as "I" is greater than zero. When the subroutine begins, a zero is stored in memory location "I." Memory location "I" is then read. If the value stored in memory location "I" is not equal to zero, a message is printed stating that there is a memory error at location "I" for a zero. Meaning that the memory cell did not correctly store or read a zero for that memory cell. The subroutine stores and reads a one at memory location "I." If the value stored in memory location "I" is not equal to one, a message is printed stating that there is a memory error at location "I" for a one. This process is repeated for the other three memory cells. The first line of "MEMCK" subroutine is another example of a non-sequential instruction.

Table I includes a portion of the simulation input file. Other portions of the simulation input file typically include other non-sequential instructions.

The simulation input file is processed to generate object code, an entry table, and a comment table (step 102). The processing is performed using a machine including a computer, a data processor, or the like and has an assembler, compiler, or the like. The entry table includes entries and line counts, and the comment table includes input comment lines. A portion of the entry and comment tables are shown in Table II and Table III, respectively.

TABLE II

```
ENTRY TABLE
comment_entry[24576]=0; // 6000
comment_count[24576]=1; // 6000
comment_entry[24579]=1; // 6003
comment_count[24579]=1; // 6003
comment_entry[24627]=2; // 6033
comment_count[24627]=2; // 6033
      •
      •
      •
```

TABLE III

```
COMMENT TABLE
comment_table[00]= "6000 ce 00 00  LDX #$0000 INITIALIZE X REG ";
comment_table[01]= "6003 db 03 12  RUN MEMCK                    ";
comment_table[02]= "; READ INPUT ON PORTH                       ";
comment_table[03]= "6033 fc 10 24  LDD PORTH                    ";
      •
      •
      •
```

The entry table (Table II) has entries and line counts. The comment table (Table III) has comment lines. Each of the entries of the entry table is similar to an index or pointer that are associated with at least one comment line. Each of the line counts of the entry table indicate how many comment lines are associated with a particular entry. Entries and line counts having the same value within the brackets (i.e., 24576, 24579, 24627, etc.) form entry-line count pairs.

Reference is now made to specific lines within the entry table. The first entry in the entry table is set equal to zero ("comment_entry[24576]=0") and is associated with instruction cache location 6000 ("// 6000"). Anytime an address bus of the integrated circuit 20 refers to instruction cache location "$6000," the machine knows that register "X" is being loaded with "#$0000." The first line count of the entry table is set equal to one (comment_count[24576] =1") and is also associated with instruction cache location 6000 ("// 6000"). The other lines in the entry table are generated in a similar manner. The second entry is associated with instruction cache location $6003 ("// 6003"), and the third entry is associated with instruction cache location $6033 ("// 6033"). The significance of the instruction cache location is discussed later in this specification.

A model file is generated of the electronic design of the integrated circuit 20 (step 104). The model file includes a hardware representation of that electronic circuit design. The model file may be generated by a person or a machine including a computer, data processor, or the like.

A simulation program is run using the object code, entry table, comment table, and model file to simulate the electronic circuit design of integrated circuit 20 (step 106). The simulation program is run on a machine including a computer, data processor, or the like. The simulation program tests the electronic circuit design. As part of the simulation, test vectors are generated that represent the status of the electrodes of the electronic circuit design for each instruction in the object code. The machine associates the entries, line counts, comment lines, and test vectors with one another.

A person can instruct the machine running the simulation program to capture test vectors and output comment lines to form a simulation results file during the simulation (also in step 106). In this particular embodiment, the machine is monitoring an address bus of the integrated circuit 20 for specific "fetches" from an instruction cache within the integrated circuit 20. The instruction cache may be part of the memory 24. When generating the simulation results file, the machine knows to refer to the entry and comment tables when the machine sees a value of the address bus that is recognized by the machine as being a programmed "fetch."

Table IV is a portion of the simulation results file. Comment lines start with a "%" and all other lines shown in are test vector lines. The test vector lines include a simulation time portion at the left end of the line and binary value portion to the right of the simulation time portion. In this example, the binary value portions are the test vectors. In other embodiments, other types of values (decimal, hexadecimal, or the like) can be used. The generation of the simulation results file is discussed in more detail after Table IV.

TABLE IV

```
%6000 ce 00 00    LDX #$0000 INITIALIZE X REG
    2240 0110000000000000 110111000000000 00000000
    2340 0110000000000010 000000001111111 00000000
%6003 db 03 12    RUN MEMCK
    2440 0110000000000011 0001011000000111 00000000
         .
         .
         .
    4030 0110000000110010 1110110000101011 00000000
% READ INPUT ON PORTH
%6033 fc 10 24    LDDPORTH
    4130 0110000000110011 0010100111101010 00000000
         .
         .
         .
```

The machine runs the simulation program with the object code guiding and controlling the simulation. Referring to Table I, the second line of main program loads register "X" with #$0000. This instruction is at instruction cache location $6000. The machine sees the $6000 on the address bus and checks the entry table for an entry related to instruction cache location $6000. The first entry line in the entry table (Table II) is related instruction cache location $6000. The first line count within the entry table is also related to instruction cache location $6000. The first entry and line count instruct the machine to capture a first output comment line within the simulation results file (Table IV). That output comment line is similar to the quoted portion of the first input comment line of the comment table (Table III).

The first output comment line is the first line captured in the simulation results file. The test vector associated with that instruction cache location is captured as the next line in the simulation results file as shown in Table IV. Note that the sixteen positions of the test vector line after "2240" are a binary representation of "$6000," where each hexadecimal position is represented by four positions.

The simulation of the electronic circuit design and generation of the simulation results file continues. The third line of the results file includes a test vector line that starts with "2340." The next sixteen positions of the test vector line are a binary representation of "$6002." The machine determines that Table II does not have an entry and line count related to instruction cache location "$6002," and therefore, no comment line is captured before this test vector line. The portion of the object code that corresponds to the next line of the source code "RUN MEMCK" is related to an instruction cache location $6003. The machine refers to the entry table and determines that there is an entry and line count related to instruction location "$6003." The machine captures the next output comment line that corresponds to next line of the comment table into the simulation results file. The test vector associated with that instruction location is captured as the next line.

After finishing the "RUN MEMCK" subroutine, the machine reaches the object code related to the "PORTH" lines of the source code. Loading register "D" with the value on port "H" is at an instruction cache location of "$6033." The machine determines that there is an entry and line count related to instruction location "$6033." The line count is two. The machine captures the next two output comment lines that correspond to the next two input comment lines from the comment table into the simulation results file. The next line in the simulation results file is the test vector line associated with "$6033." Capturing of the simulation results file continues in a similar manner. During the simulation, at least one of the instruction cache locations (i.e., $6000) can be used more than one time. The entry and comment tables are used to link the appropriate comment with its associated test vector.

After the simulation, the simulation results file should be reviewed (step 108). The review is to confirm the simulation was successful. If not, the simulation input file or the model file can be modified and the simulation run again.

If the review of the simulation results file indicates that the simulation is successful, masks associated to the electronic circuit are generated (step 112). The electronic circuit is laid out using a machine, such as a computer, to generate magnetic tapes. The magnetic tapes are used to generate masks, as shown in FIGS. 3–7. In this specific embodiment, these masks are used to form the integrated circuit 20 that includes an electrically programmable read-only memory (EPROM) cell within the memory 24. In this example, the masks are stencil masks used with positive resist. If negative resist is used, the masks are mirror images of the ones shown.

Figure 3:
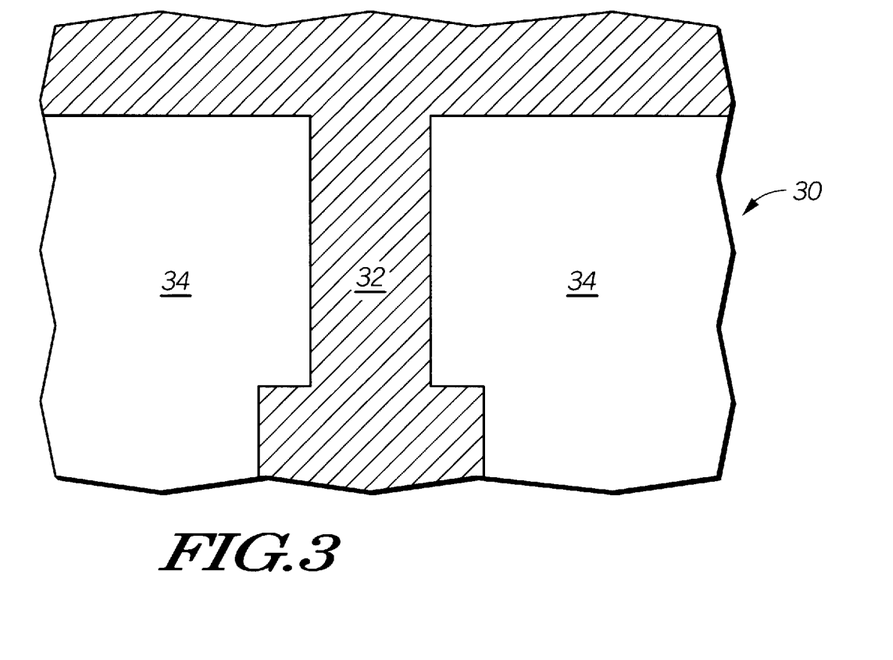
FIGS. 3–7 include plan views of portions of masks for an integrated circuit.
Figure 4:
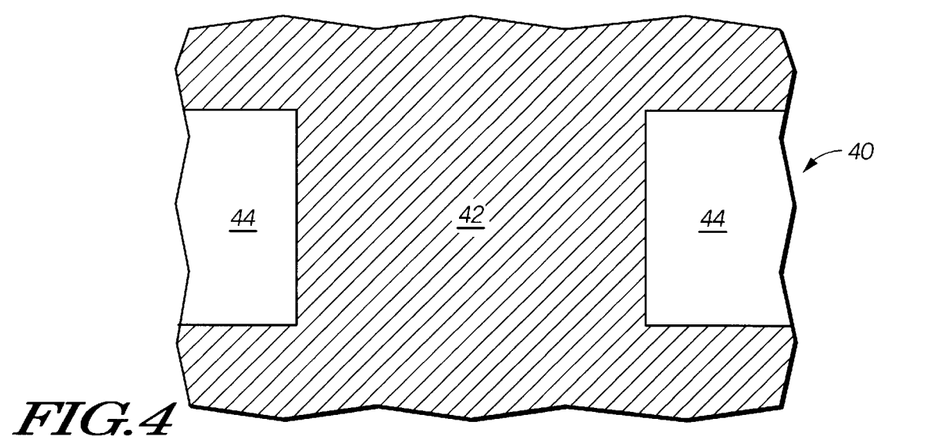

FIG. 3 includes an illustration of a plan view of a portion of a field isolation mask 30. The field isolation mask 30 includes transparent regions 34 and a chrome element 32. In mask 30, the chrome element 32 generally corresponds to locations where the active region is formed. The transparent regions 34 generally correspond to where field isolation regions are formed. A transparent region is a region that is transparent to the radiation source used when selectively exposing a resist layer using the mask. A portion of a floating polycrystalline silicon (polysilicon) mask 40 is shown in FIG. 4. Chrome element 42 generally corresponds to a location where floating polysilicon will initially remain after a floating polysilicon etch. Regions 44 are transparent.

Figure 5:
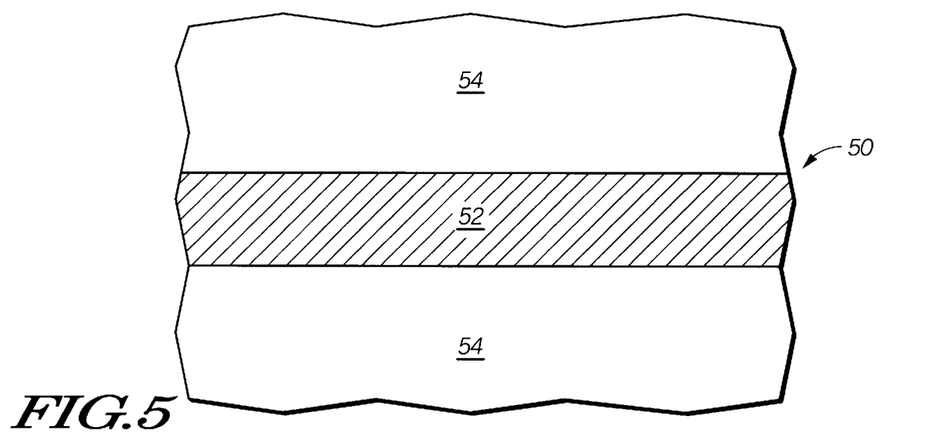
Figure 6:
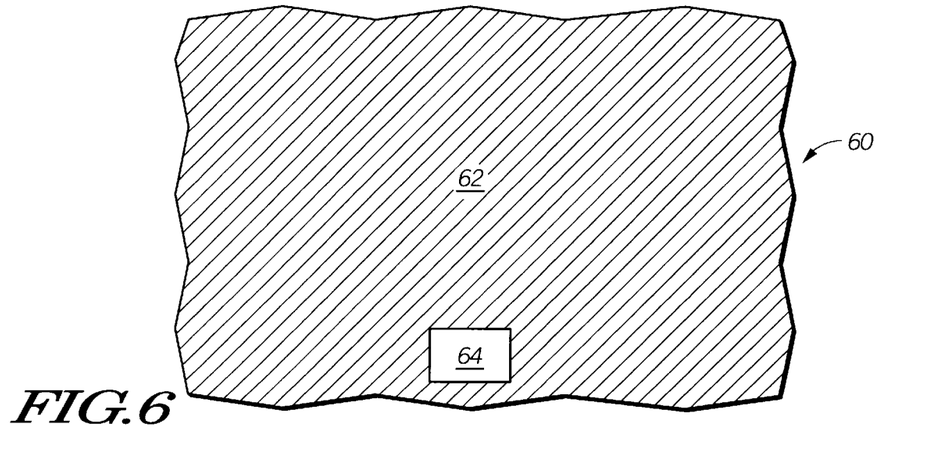
Figure 7:
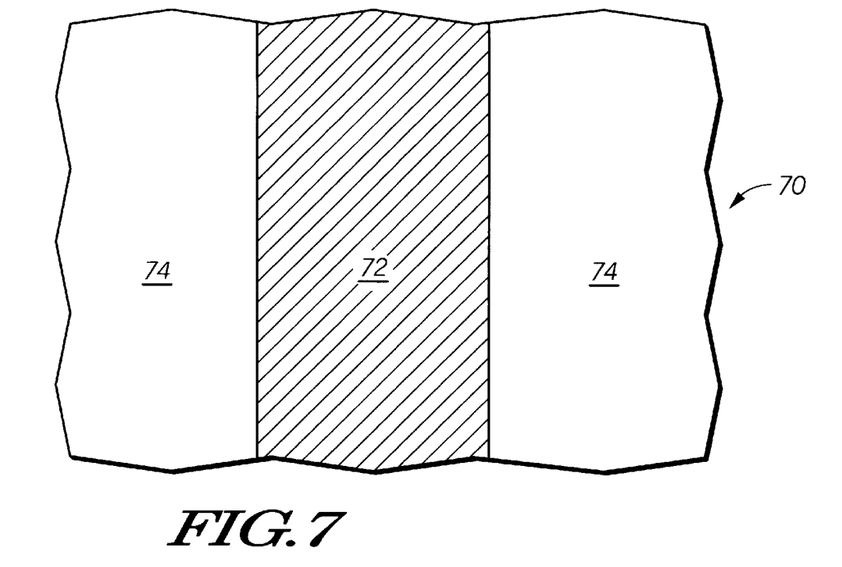

FIG. 5 includes an illustration of a plan view of a portion of control gate polysilicon mask 50. Chrome element 52 generally corresponds to a location of a control gate member, and regions 54 are transparent. After control gate polysilicon mask 50 is used to expose selectively a resist layer, a two-step etch sequence is used remove portions of the floating gate polysilicon layer and control gate polysilicon layer that are not covered by the unexposed portion of the resist layer (self-aligned, stacked gate EPROM). A portion of contact mask 60 is shown in FIG. 6 and includes a chrome element 62 and a transparent portion 64 that generally corresponds to a location where a contact is formed. Metal mask 70 includes a chrome element 72 and transparent regions 74 as shown in FIG. 7. The chrome element generally corresponds to a location where a metal bit line is formed.

Figure 8:
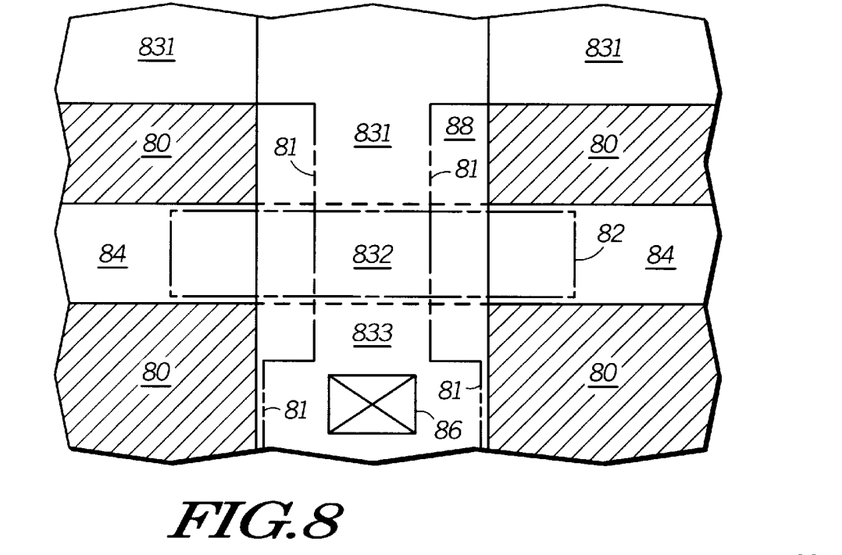
FIG. 8 includes a plan view of a portion of an integrated circuit.

FIG. 8 includes an illustration of a plan view of a portion of the integrated circuit 20 including the EPROM cell. The integrated circuit 20 is formed from by processing a semiconductor substrate using the masks illustrated in FIGS. 3–7 (step 114 of FIG. 2). FIG. 8 includes field isolation regions 80 and an active region 81 that includes source region 831, a channel region 832, and a drain region 833. The edges of the active region underlying interconnect 88 are illustrated with a line-dash-dash-line designation. The source region 831 is a portion of the active region 81 that lies adjacent to the word line and lies near the top of FIG. 8. The drain region 833 is a portion of the active region 81 that lies near the bottom of FIG. 8. The channel region 832 is defined by the source and drain regions 831 and 833 and underlies a floating gate member 82.

The floating gate member 82 overlies the channel region 832 and portions of the field isolation regions 80 and underlies the control gate member 84. The edges of the floating gate member 82 are illustrated by a line-dash-line designation. The control gate member 84 overlies the floating gate member 82 and portions of the field isolation regions 80. The portion of the control gate member 84 that underlies the interconnect 88 is illustrated with a dashed line. A contact 86 is shown by a ⊠ in FIG. 8. The contact 86 can be a contact plug or a location when the interconnect 88 contacts the drain region 833. In either case, the contact 86 is a location where electrical contact is made between the interconnect 88 and the underlying drain region 833.

After reviewing the simulation results file, a test input file is also generated (step 122 of FIG. 2). Usually, a machine that runs the simulation program is different from the machine that performs the test of the integrated circuit. The simulation results file is translated to the language used by the testing maching (i.e., tester) to form a test input file. The test input file is compiled by the tester. The test input file can be formed and compiled any time after the simulation and before the integrated circuit 20 needs to be tested.

The integrated circuits are placed in the tester. The tester uses the test input file and generates a test results file (also step 126). The test vectors generated from the test input file are used to drive inputs and verify outputs from the integrated circuits 20. If all inputs and outputs of the integrated circuit 20 match the test vector then the integrated circuit passes. If any inputs or outputs differ, the integrated circuit 20 is flagged as failing the test, and the tester captures the test vector into a test results. After the testing is completed, the test results file or a portion of it can be reviewed to detect problems with the test input file or the integrated circuit 20. Usually, the test vectors in the test results files are matched with their corresponding test vectors of the simulation results file. In the simulation results file, comment lines adjacent to the corresponding test vectors are examined and help to isolate the source of the failure.

Figure 9:
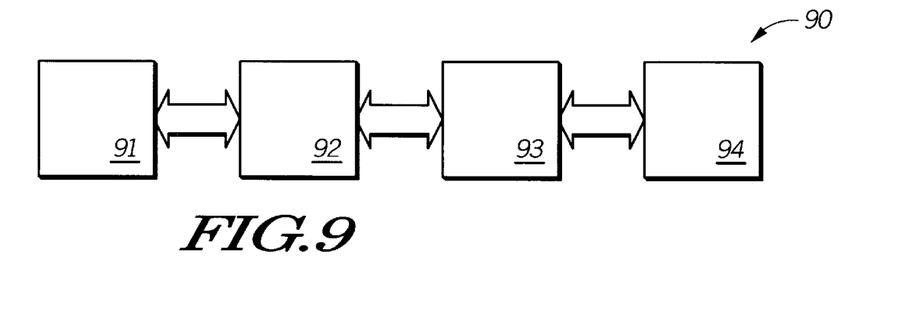
FIG. 9 includes a plurality of integrated circuits coupled to one another.

The method of the present invention is not limited to just an integrated circuit. The method can be used to simulate a module or modules within the integrated circuit 20 including the central processing unit 22 or the memory 24. The method can also be used to for a plurality of integrated circuits 90, such as the integrated circuits 91–94 in FIG. 9. Each of the integrated circuits 91–94 is bi-directionally coupled to at least one other integrated circuit. The integrated circuits 91–94 can include microcontrollers, microprocessors, digital signal processors, memories, or the like.

A comparison between this embodiment and conventional methods help to illustrate differences and benefits of the present invention. With the embodiment, an entry table having entries and line counts is generated to provide a linking mechanism between comment lines and test vector lines. In a conventional method, there are no entries or line counts. Therefore, the conventional method has no way of assuring that a comment line will be placed in a results file adjacent to its associated test vector.

Another difference between the embodiment and a conventional method is that the comment lines and test vector lines are captured into a results file as the simulation is performed. A conventional method creates a test vector table and a comment table. That comment table is created by post-processing of the assembly input file. After the simulation is completed, a computer generates results file that essentially merges the comment lines and test vector lines. This post-simulation generation of a results file typically assumes linear (sequential) program flow and that two to four test vectors are associated with each comment line. In other words, "RUN MEMCK" would be assumed to correspond to two to four test vectors when it could correspond to 48 test vector lines that are before the output comment lines and test vector lines for loading register "D" with the value on port "H". The two comment lines related to "PORTH" and "LDD" would be placed with the test vectors for subroutine "MEMCK." These comment lines are about 40 test vector lines away from their associated test vectors. Note that subsequent comment lines are typically affected by this misplacement.

A skilled artisan appreciates that the embodiment of the present invention clearly overcomes the problems related to non-sequential instructions. The conventional methods can be essentially useless for programs or subroutines having many non-sequential instructions. The embodiment of the present invention does not need post-simulation processing to generate a results file. Also, a person does not need to double check a results file to make sure the comment lines are placed adjacent to their associated test vectors.

An embodiment of the present invention generates the results file while running the simulation. In another embodiment, the results file can be generated during post-simulation processing. The linking between the comment lines and their associated test vectors can be accomplished by using the entry table. The post-processing generation of the results file would look at the sixteen positions of the test vector line that corresponds to the instruction location. If there is an entry and line count with the same instruction location, the comment line would be extracted from the comment table and placed adjacent to its associated test vector.

The methods of present invention has a number of additional benefits over the prior art. The method is less time consuming than conventional methods. Valuable time is not wasted linking lines of comments with their associated test vectors. The use of the entries and line counts allows a machine to link properly comment lines to their associated test vectors. This allows comment lines to be placed adjacent to their associated test vectors. The method does not make assumptions where comments should be inserted. A person is not needed to check the output file to adjust the position of comment lines in relation to the test vectors.

Another benefit is that the method is not error prone. A person can make a mistake when linking comment lines to test vectors when an output file has hundreds of thousands of lines of test vectors. The method does not use assumptions of the conventional computer methods. Therefore, the program or subroutines with the program can use several non-sequential instructions and still have the comment lines placed adjacent to their associated test vectors.

Another benefit is a reduction in the total cycle time from conception of an idea for an electronic circuit design until the time the corresponding electronic circuit is formed. This benefit is achieved by using an automated process that is less error prone.

Integrated circuits can have over a million transistors which can make simulations very difficult. As future generations of electronic circuits become increasingly complicated, the usefulness of this program will become more noticeable.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A method of forming an integrated circuit comprising the steps of:
    simulating an electronic circuit design including steps of:
        generating simulation input file including source code;
        processing the simulation input file to generate object code, an entry, and an input comment line;
        generating a model file that represents the electronic circuit design; and
        running a simulation program using a first machine, wherein:
            the simulation program uses the object code, the entry, the input comment line, and the model file;
            a simulation results file is generated by capturing an output comment line and a plurality of test vectors;
            the output comment line corresponds to the input comment line;
            the output comment line has an associated test vector;
            the output comment line is placed adjacent to its associated test vector by using the entry; and
            a portion of the plurality of test vectors does not have an associated output comment line; and
    generating a plurality of masks corresponding to the electronic circuit design after the step of simulating; and
    processing a substrate using the plurality of masks to form the integrated circuit.

2. The method of claim 1, wherein the step of generating the simulation input file is performed such that:
    the simulation input file includes a non-sequential instruction; and
    the non-sequential instruction has a corresponding test vector that is generated before the associated test vector.

3. The method of claim 1, wherein:
    the step of processing the simulation input file generates a line count that is associated with the entry; and
    the step of running uses the line count to determine how many output comment lines are placed adjacent to the associated test vector.

4. The method of claim 1, wherein the step of running is performed such that, within the simulation results file, the output comment line is on a line immediately adjacent to the associated test vector.

5. The method of claim 1, wherein the step of processing the substrate is performed such that the integrated circuit selected from a group consisting of a microcontroller, a microprocessor, and a digital signal processor.

6. A method of forming an integrated circuit comprising the steps of:
    simulating an electronic circuit design including steps of:
        generating simulation input file that includes source code;
        processing the simulation input file to generate object code, an entry, and an input comment line:
        generating a model file that represents the electronic circuit design;
        running a simulation program using the object code, the entry, the input comment line, and the model file to generate an output comment line and a plurality of test vectors, wherein the output comment line corresponds to the input comment line; and
        generating a simulation results file using a first machine after the step of running, wherein:
            the output comment line has an associated test vector;
            the output comment line is placed adjacent to its associated test vector by using the entry; and
            a portion of the plurality of test vectors does not have an associated output comment line; and
    generating a plurality of masks corresponding to the electronic circuit design after the step of simulating; and
    processing a substrate using the plurality of masks to form the integrated circuit.

7. The method of claim 6, wherein the step of generating the simulation input file is performed such that:
    the simulation input file includes a non-sequential instruction; and the non-sequential instruction has a corresponding test vector that is generated before the associated test vector.

8. The method of claim 6, wherein the step of generating the simulation results file is performed such that the output comment line is on a line immediately adjacent to the associated test vector.

9. The method of claim 6, wherein the step of processing the substrate is performed such that the integrated circuit selected from a group consisting of a microcontroller, a microprocessor, and a digital signal processor.

10. A method of claim 6, further comprising steps of:

generating a test input file from the simulation results file, where:

the test input file includes test vectors; and each of the test vectors of the test input file has a corresponding test vector of the simulation results file;

placing the integrated circuit into a second machine; and testing the integrated circuit on the second machine, wherein the second machine:

uses the test input file;

compares the test vectors of the test input file to test vectors of the integrated circuit; and generates a test results file by capturing at least one test vector.

11. The method of claim 10, further comprising steps of:

matching the at least one test vector of the test results file with its corresponding test vector of the simulation results file; and examining at least one output comment line within the simulation results file that is near the test vector of the simulation results file.

12. A method of claim 1, further comprising steps of:

generating a test input file from the simulation results file, where:

the test input file includes test vectors; and each of the test vectors of the test input file has a corresponding test vector of the simulation results file;

placing the integrated circuit into a second machine; and testing the integrated circuit on the second machine, wherein the second machine:

uses the test input file;

compares the test vectors of the test input file to test vectors of the integrated circuit; and generates a test results file by capturing at least one test vector.

13. The method of claim 12, further comprising steps of:

matching the at least one test vector of the test results file with its corresponding test vector of the simulation results file; and examining at least one output comment line within the simulation results file that is near the test vector of the simulation results file.

* * * * *